United States Patent [19]
Ackley et al.

[11] Patent Number: 5,627,931
[45] Date of Patent: May 6, 1997

[54] OPTOELECTRONIC TRANSDUCER

[75] Inventors: Donald E. Ackley, Lambertville, N.J.; John W. Stafford, Phoenix, Ariz.

[73] Assignee: Motorola, Schaumburg, Ill.

[21] Appl. No.: 654,488

[22] Filed: May 28, 1996

[51] Int. Cl.⁶ .................................................. G02B 6/36
[52] U.S. Cl. .................................................. 385/88; 385/49
[58] Field of Search .................................. 385/88, 89, 90, 385/91, 92, 93, 94, 49, 14

[56] References Cited

U.S. PATENT DOCUMENTS

| | | |
|---|---|---|
| 5,247,597 | 9/1993 | Blacha et al. ................... 385/88 |
| 5,394,490 | 2/1995 | Kato et al. ...................... 385/88 |
| 5,479,540 | 12/1995 | Boudreau et al. ............... 385/92 |

*Primary Examiner*—John Ngo
*Attorney, Agent, or Firm*—Eugene A. Parsons

[57] ABSTRACT

An optoelectronic transducer includes a fiber carrier having a groove formed in a major side with an optical fiber mounted in the groove and a reflecting surface positioned adjacent one end of the groove so as to direct light in-to/out-of the optical fiber. A photonic device carrier having a photonic device fixedly mounted on a major side. Mounting pads positioned on the major sides of the carriers are affixed together so that the photonic device is optically aligned with the reflecting surface and light traveling in-to/out-of the optical fiber is directed out-of/in-to the photonic device. The carriers are formed of materials with similar thermal coefficients of expansion, such as silicon and ceramic.

30 Claims, 2 Drawing Sheets

OPTOELECTRONIC TRANSDUCER

FIELD OF THE INVENTION

The present invention pertains to optoelectronic transducers and to fabrication techniques for optoelectronic transducers.

BACKGROUND OF THE INVENTION

Many telecommunications applications of fiber optics require the fixing (or pigtailing) of an optical fiber to the active area of a photodetector or light generating device, such as a laser, or light emitting diode. This fixing process must serve several functions, which functions include: 1) optical alignment of signals carried by the optical fibers to the optical device; 2) permanent physical attachment of the fiber to hold the alignment stable over time, temperature, shock, vibrations and other environmental conditions; and 3) electrical connection and preservation of signal integrity, which means that wire bonding, soldering, or otherwise providing electrical signal contact from the assembly to a host circuit board must be provided. Many applications also require that parasitic capacitance and/or inductance be minimized in the assembly.

The process of aligning and fixing an optical fiber to an optical device, while satisfying all of the above criteria, can be very costly. If the alignment is accomplished by a procedure referred to in the art as "active alignment" (i.e., monitoring of optoelectronically induced signals while aligning) the cost is very high because this procedure is labor intensive. A specific application in telecommunications, namely analog optical receivers used in subcarrier multiplexing applications (such as CATV receivers), has particularly demanding requirements of this fixturing process. In this application, a single single-mode optical fiber with a core diameter of approximately 8 µm must be aligned to the center of a 60 µm active area of a photodetector. To maintain photodetector linearity, the center or core of the optical fiber must be aligned within approximately 10 µm of the center of the photodetector active area, even though the diameter of the photodetector active area is 60 µm.

Prior devices in this field involve fixturing of the optical fiber in a precision machined ceramic fixture that allows for freedom of movement of the optical fiber relative to the optical device and subsequent fixing by means of an adhesive.

An example of one type of pigtailed optoelectronic assembly is disclosed in U.S. Pat. No. 5,361,317, entitled "Assembly With Fixture Aligning and Affixing an Optical Fiber to an Optical Device", issued Nov. 1, 1994 and assigned to the same assignee.

It is a purpose of the present invention to provide a new and improved single optical fiber optoelectronic transducer.

It is a further purpose of the present invention to provide a new and improved single optical fiber/device assembly which is relatively simple to fabricate and use.

It is another purpose of the present invention to provide a new and improved single optical fiber/device assembly which includes components with reduced temperature problems and with reduced capacitance.

SUMMARY OF THE INVENTION

The above described problems and others are at least partially solved and the above purposes and others are realized in an optoelectronic transducer and method of fabrication including a fiber carrier having a groove formed in a major side with an optical fiber mounted in the groove and a reflecting surface positioned adjacent one end of the groove so as to direct light in-to/out-of the optical fiber. A photonic device carrier having a photonic device fixedly mounted on a major side. Mounting pads positioned on the major sides of the carriers are affixed together so that the photonic device is optically aligned with the reflecting surface and light traveling in-to/out-of the optical fiber is directed out-of/in-to the photonic device. The carriers are formed of materials with similar thermal coefficients of expansion, such as silicon and ceramic.

BRIEF DESCRIPTION OF THE DRAWINGS

Referring to the drawings.

DESCRIPTION OF THE PREFERRED EMBODIMENT

Figure 1:
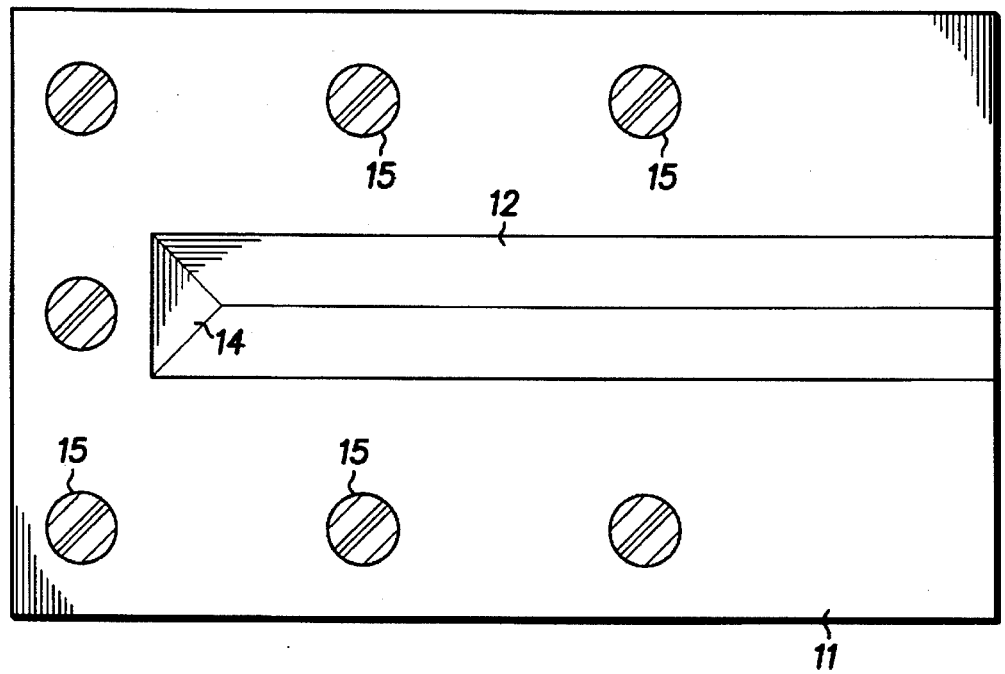
FIG. 1 is a view in top plan of a fiber carrier.

Turning now to the drawings in which like characters designate like parts throughout the several views, FIG. 1 is a view in top plan of a fiber carrier 10. Fiber carrier 10 may be, for example, a semiconductor material such as silicon or the like, since the semiconductor industry is set up to work on these materials and many semiconductor processes and techniques can be used in the following process. Also, these materials generally have a thermal coefficient of expansion which is matched to other materials to be explained. Fiber carrier 10 is formed as a thin rectangularly shaped substrate having a major side 11, which in FIG. 1 is the upper surface.

A groove 12 is formed in major side 11 of fiber carrier 10, which groove 12 extends from one edge of fiber carrier 11 to a mid-point. While groove 12 may be formed with substantially any convenient cross-section, in this preferred embodiment the cross-section is substantially V-shaped to enhance the positioning of an optical fiber therein. Groove 12 is further formed with an angled, reflective surface 14 at the inner end, which surface 14 is made to reflect light, by simply polishing or metalizing, for example. Surface 14 is positioned adjacent to one end of groove 12 so as to direct light in-to/out-of groove 12 and substantially perpendicular to major side 11. In this preferred embodiment, surface 14 is formed at an angle to the axis of groove 12 which is in a range of approximately 40° to 60° and preferably at approximately 55°. One process of forming surface 14 is to preferentially grow crystals, such as silicon crystals, so that a crystal plane forms surface 14 at the desired angle.

A plurality of mounting pads 15 are formed on major side 11 of fiber carrier 10 at any convenient locations. Mounting pads 15 are precisely located with respect to surface 14 and groove 12, for reasons that will be explained presently. Generally, mounting pads 15 can be formed by any of the well known semiconductor metalization processes. Further, if surface 14 is metalized to provide the reflectivity, it can be conveniently accomplished at the same time as the metalization process used to form mounting pads 15.

Figure 2:
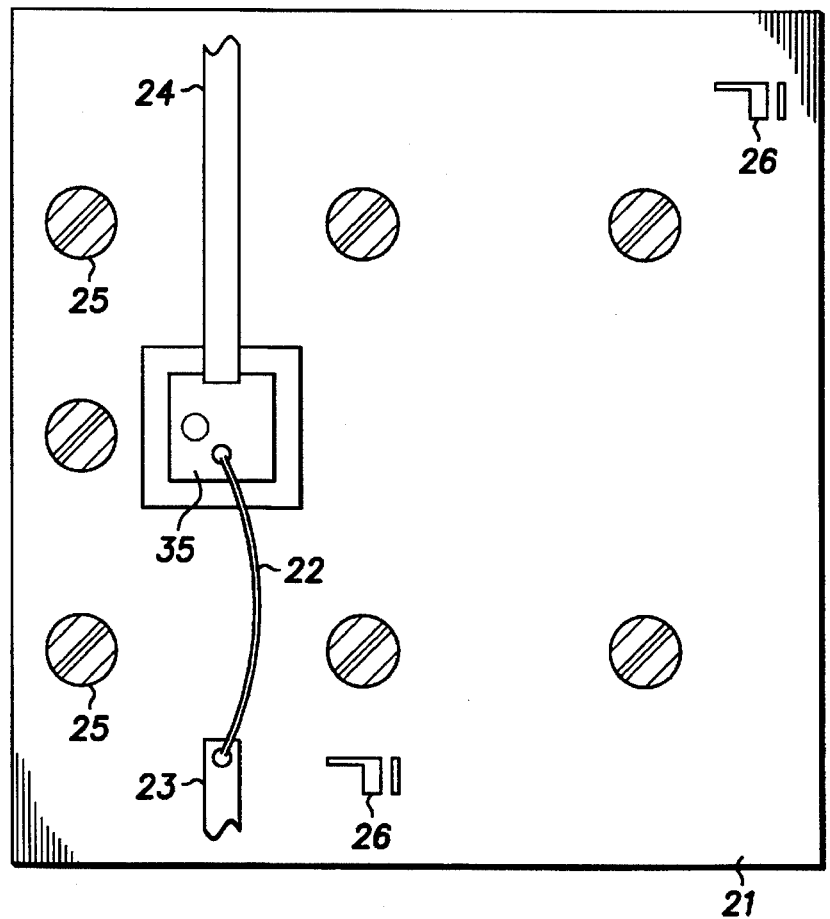
FIG. 2 is a view in top plan of a photonic device and carrier.

Turning now to FIG. 2, a photonic device carrier 20 is illustrated. Photonic device carrier 20 may be, for example, a ceramic material, or a semiconductor material such as silicon or the like. Ceramic is preferred in this structure because of the strength it adds while resulting in extremely low parasitic capacitance. Also, these materials generally have a thermal coefficient of expansion which is matched to other materials, such as the material of fiber carrier 10 and the materials of a photonic device, to be explained. Photonic device carrier 20 is formed as a thin rectangularly shaped substrate having a major side 21, which in FIG. 2 is the upper surface.

Thin film metalization is applied to major side 21 of photonic device carrier 20 by any of the well known processes and defines a chip mounting pad 22, a wire bond pad 23, an electrical connection 24 to chip mounting pad 22, and a plurality of mounting pads 25. Mounting pads 25 are precisely positioned with respect to chip mounting pad 22 and are further positioned to mate with mounting pads 15 on fiber carrier 10. Also defined in the metalization process are fiducials 26, which are used in conjunction with fiducials on a photonic chip, to enable alignment and die attachment of the photonic chip to photonic device carrier 20 with accuracy's on the order of 2 μm. It will of course be understood that other fiducials might be supplied and used, but those described are preferred because of the ease of formation.

In the final assembly, to be explained presently, fiber carrier 10 is affixed to photonic device carrier 20 by connecting mounting pads 15 to mounting pads 25. Before attaching a die to chip mounting pad 22, solder balls are placed on mounting pads 25 and reflowed to form precisely sized solder bumps with vertical and lateral tolerances of a few microns. As will be understood, the solder bumps are formed before die attachment so that the die will not be subjected to the heat of the reflow process. It should also be understood that solder bumps can similarly be formed on fiber carrier 10 in addition to or instead of being formed on photonic device carrier 20.

With the various formation and metalization steps completed, an optical fiber 30 (see FIG. 3) is positioned in groove 12 of fiber carrier 11. If groove 12 is formed with a V-shaped cross-section, optical fiber 30 is automatically centered in groove 12. Also, optical fiber 30 is moved longitudinally along groove 12 until the end butts against surface 14. This operation automatically positions optical fiber 30 in the correct position relative to surface 14 so that the maximum light is coupled between optical fiber 30 and a photonic device, to be explained. Optical fiber 30 can be a single mode optical fiber or a multi-mode optical fiber, depending upon the ultimate application of the electro-optical transducer. Optical fiber 30 is fixedly attached in groove 12 by any convenient means, such as epoxy 31, solder, or any convenient adhesive or bonding agent.

A photonic device 35 is provided, which device 35 may be either a light receiver or a light transmitter and may include any of the following devices: a semiconductor photodiode, an organic photodiode, a semiconductor light emitting diode, an organic light emitting diode, a semiconductor laser, a vertical cavity surface emitting laser, etc. In instances where photonic device 35 is fabricated on a semiconductor die or chip, the die is attached to chip mounting pad 22 in any of the well known methods used in the semiconductor art. One terminal of photonic device 35 is connected to electrical connection 24 by the mounting of the die. A second terminal of photonic device 35 is connected by wire bonding to wire bond pad 23. Thus, external connections to photonic device 35 are provided.

Figure 3:
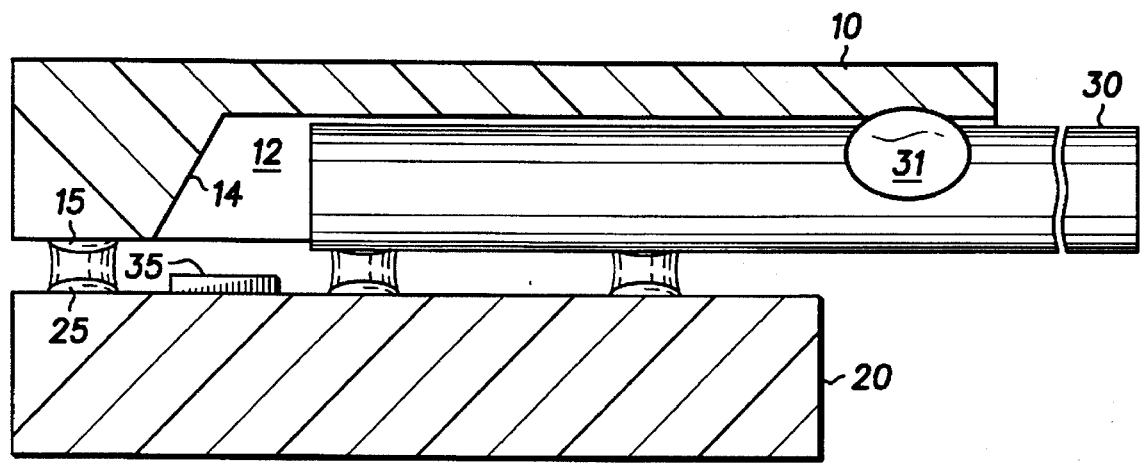
FIG. 3 is a cross-sectional view of an assembled optoelectronic transducer in accordance with the present invention.
Figure 4:
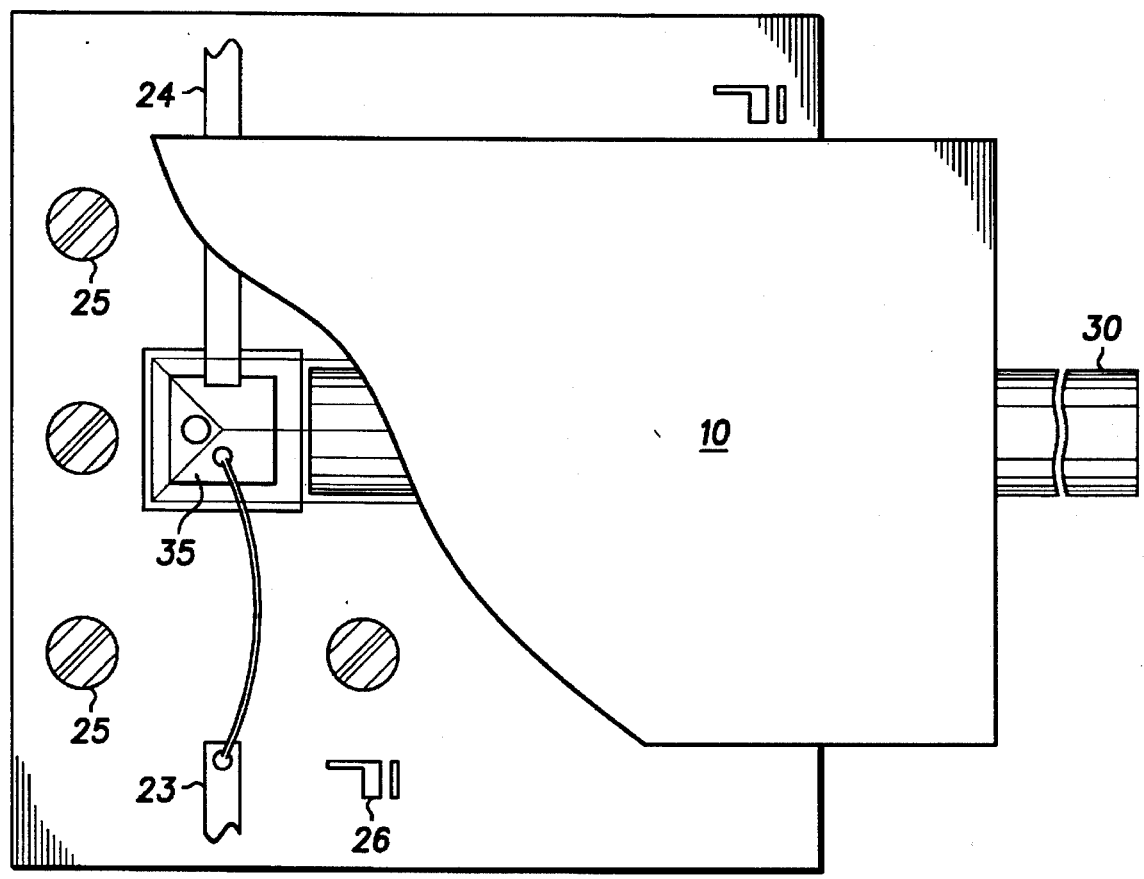
FIG. 4 is a view in top plan, portions thereof broken away, of the optoelectronic transducer of FIG. 3.

The package assembly is completed by bringing mounting pads 15 on fiber carrier 10 into contact with the solder bumps on mounting pads 25 of photonics device carrier 20 and then reflowing the solder to affix fiber carrier 10 to photonic device carrier 20. The surface tension of the reflowed solder bumps pulls the carriers into alignment with tolerances on the order of a micron. The completed package is illustrated in FIGS. 3 and 4. This alignment is sufficient to achieve good single mode coupling efficiency and minimal distortion for various applications, including CATV.

It will of course be understood that a multiple fiber carrier can be formed by etching multiple carrier grooves in the substrate, each with a reflecting surface and attaching an array of photonic devices (receivers and/or transmitters) to the photonic device carrier.

Thus, a new and improved single, or multi-mode, optical fiber optoelectronic transducer is provided along with new and improved methods of fabricating the optoelectronic transducer. The new and improved single optical fiber, optoelectronic transducer is relatively simple to fabricate and use and includes components with reduced temperature problems due to incompatible thermal coefficients of expansion and with reduced parasitic capacitance and/or inductance.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An optoelectronic transducer comprising:
 a fiber carrier having a major side with a groove formed in the major side for receiving an optical fiber therein;
 an optical fiber fixedly mounted in the groove;
 a reflecting surface formed in the major side of the fiber carrier and positioned adjacent one end of the groove so as to direct light in-to/out-of the optical fiber fixedly mounted in the groove;
 mounting pads positioned on the major side of the fiber carrier;
 a photonic device carrier having a major side;
 a photonic device fixedly mounted on the major side of the photonic device carrier, the photonic device having a light outlet/inlet;
 mounting pads positioned on the major side of the photonic device carrier so as to mate with the mounting pads positioned on the major side of the fiber carrier; and
 the mounting pads of the fiber carrier being affixed to the mounting pads of the photonic device carrier so that the outlet/inlet of the photonic device is substantially optically aligned with the reflecting surface and light traveling in-to/out-of the optical fiber is directed onto the light outlet/inlet of the photonic device.

2. An optoelectronic transducer as claimed in claim 1 wherein the optical fiber carrier and the photonic device carrier are formed of material having approximately equal thermal coefficients of expansion.

3. An optoelectronic transducer as claimed in claim 1 wherein the optical fiber carrier is formed of silicon.

4. An optoelectronic transducer as claimed in claim 1 wherein the groove in the major side of the optical fiber carrier has a V-shaped cross-section for aligning the optical fiber therein.

5. An optoelectronic transducer as claimed in claim 1 wherein the reflecting surface formed in the major side of the fiber carrier and positioned adjacent one end of the groove includes a metalized surface positioned at an angle to the major side of the fiber carrier.

6. An optoelectronic transducer as claimed in claim 1 wherein the optical fiber is a single mode optical fiber.

7. An optoelectronic transducer as claimed in claim 1 wherein the photonic device carrier includes a ceramic substrate.

8. An optoelectronic transducer as claimed in claim 7 wherein the ceramic substrate includes metalization on the major side for mounting the photonic device and for providing external electrical connections to the photonic device.

9. An optoelectronic transducer as claimed in claim 1 wherein the mounting pads of the fiber carrier are affixed to the mounting pads of the photonic device carrier by solder.

10. An optoelectronic transducer as claimed in claim 1 wherein the photonic device carrier further includes alignment fiducials on the major side for positioning the photonic device.

11. An optoelectronic transducer as claimed in claim 1 wherein the photonic device is selected from a group including a semiconductor photodiode, an organic photodiode, a semiconductor light emitting diode, an organic light emitting diode, a semiconductor laser, and a vertical cavity surface emitting laser.

12. An optoelectronic transducer comprising:
   a fiber carrier having a major side with a groove formed in the major side for receiving an optical fiber therein, the groove having a generally V-shaped cross-section, the fiber carrier having a thermal coefficient of expansion;
   an optical fiber fixedly mounted in the groove;
   a reflecting surface formed in the major side of the fiber carrier and positioned adjacent one end of the groove so as to direct light in-to/out-of the optical fiber fixedly mounted in the groove;
   metalized mounting pads positioned on the major side of the fiber carrier;
   a photonic device carrier having a major side and a thermal coefficient of expansion approximately equal to the thermal coefficient of expansion of the fiber carrier;
   a photonic device fixedly mounted on the major side of the photonic device carrier, the photonic device having a light outlet/inlet, the photonic device including one of a semiconductor photodiode, an organic photodiode, a semiconductor light emitting diode, an organic light emitting diode, a semiconductor laser, or a vertical cavity surface emitting laser;
   metalized mounting pads positioned on the major side of the photonic device carrier so as to mate with the mounting pads positioned on the major side of the fiber carrier; and
   the mounting pads of the fiber carrier being affixed to the mounting pads of the photonic device carrier so that the major side of the fiber carrier is parallel with and adjacent to the major side of the photonic device carrier and so that the outlet/inlet of the photonic device is substantially optically aligned with the reflecting surface and light traveling in-to/out-of the optical fiber is directed onto the light outlet/inlet of the photonic device.

13. An optoelectronic transducer as claimed in claim 12 wherein the optical fiber carrier is formed of silicon.

14. An optoelectronic transducer as claimed in claim 12 wherein the photonic device carrier includes a ceramic substrate.

15. An optoelectronic transducer as claimed in claim 14 wherein the ceramic substrate includes metalization on the major side for mounting the photonic device and for providing external electrical connections to the photonic device.

16. An optoelectronic transducer as claimed in claim 12 wherein the mounting pads of the fiber carrier are affixed to the mounting pads of the photonic device carrier by solder.

17. An optoelectronic transducer as claimed in claim 12 wherein the photonic device carrier further includes alignment fiducials on the major side for positioning the photonic device.

18. A method of fabricating an optoelectronic transducer comprising the steps of:
   forming a fiber carrier having a major side, forming a groove in the major side for receiving an optical fiber therein;
   forming a reflecting surface in the major side of the fiber carrier positioned adjacent one end of the groove so as to direct light from the groove at an angle to the major side;
   forming first mounting pads on the major side of the fiber carrier;
   mounting an optical fiber in the groove with an end of the optical fiber positioned adjacent the reflecting surface so as to receive light therefrom;
   forming a photonic device carrier with a major side;
   forming second mounting pads on the major side of the photonic device carrier and positioning the second mounting pads so as to mate with the first mounting pads positioned on the major side of the fiber carrier;
   providing a photonic device having a light outlet/inlet and mounting the photonic device on the major side of the photonic device carrier; and
   affixing the first mounting pads of the fiber carrier to the second mounting pads of the photonic device carrier so that the major side of the fiber carrier is parallel with and adjacent to the major side of the photonic device carrier and so that the outlet/inlet of the photonic device is substantially optically aligned with the reflecting surface and light traveling in-to/out-of the optical fiber is directed out-of/in-to the light outlet/inlet of the photonic device.

19. A method of fabricating an optoelectronic transducer as claimed in claim 18 wherein the steps of forming the fiber carrier and the photonic device carrier include forming the fiber carrier and the photonic device carrier of material having approximately equal thermal coefficients of expansion.

20. A method of fabricating an optoelectronic transducer as claimed in claim 18 wherein the step of forming the fiber carrier includes forming the fiber carrier of silicon.

21. A method of fabricating an optoelectronic transducer as claimed in claim 18 wherein the step of forming the groove in the major side of the optical fiber carrier includes forming the groove with a V-shaped cross-section for aligning the optical fiber therein.

22. A method of fabricating an optoelectronic transducer as claimed in claim 21 wherein the step of forming the reflecting surface in the major side of the fiber carrier and positioning the reflecting surface adjacent one end of the groove includes forming a metalized surface and positioning the metalized surface at an angle to the major side of the fiber carrier.

23. A method of fabricating an optoelectronic transducer as claimed in claim 22 wherein the step of mounting the optical fiber includes utilizing the V-groove to laterally align the optical fiber and butting an end of the optical fiber against the reflecting surface to axially align the optical fiber.

24. A method of fabricating an optoelectronic transducer as claimed in claim 18 wherein the step of mounting the optical fiber includes mounting a single mode optical fiber.

25. A method of fabricating an optoelectronic transducer as claimed in claim 18 wherein the step of forming the photonic device carrier includes forming a photonic device carrier of a ceramic substrate.

26. A method of fabricating an optoelectronic transducer as claimed in claim 25 wherein the step of forming a photonic device carrier of the ceramic substrate includes forming metalization on the major side for mounting the photonic device and for providing external electrical connections to the photonic device.

27. A method of fabricating an optoelectronic transducer as claimed in claim 18 wherein the step of affixing the first mounting pads of the fiber carrier to the second mounting pads of the photonic device carrier includes using solder.

28. A method of fabricating an optoelectronic transducer as claimed in claim 27 wherein the step of affixing the first mounting pads of the fiber carrier to the second mounting pads of the photonic device carrier using solder includes the steps of positioning solder balls on at least the first or second mounting pads and reflowing the solder balls to form solder bumps, bringing the first mounting pads into contact with the second mounting pads, and reflowing the solder bumps to attach the first and second mounting pads.

29. A method of fabricating an optoelectronic transducer as claimed in claim 18 including in addition a step of providing alignment fiducials on the major side of the photonic device carrier for positioning the photonic device.

30. A method of fabricating an optoelectronic transducer as claimed in claim 18 wherein the step of providing the photonic device includes selecting the photonic device from a group including a semiconductor photodiode, an organic photodiode, a semiconductor light emitting diode, an organic light emitting diode, a semiconductor laser, and a vertical cavity surface emitting laser.

* * * * *